March 18, 1958 E. LIDOW 2,827,597

RECTIFYING MOUNTING

Filed Oct. 2, 1953 3 Sheets-Sheet 1

INVENTOR.
ERIC LIDOW.

D. Gordon Angus
ATTORNEY.

March 18, 1958 E. LIDOW 2,827,597

RECTIFYING MOUNTING

Filed Oct. 2, 1953 3 Sheets-Sheet 2

INVENTOR.
ERIC LIDOW.

D. Gordon Angus

ATTORNEY.

March 18, 1958 E. LIDOW 2,827,597

RECTIFYING MOUNTING

Filed Oct. 2, 1953 3 Sheets-Sheet 3

INVENTOR.
ERIC LIDOW.

D. Gordon Angus
ATTORNEY.

United States Patent Office 2,827,597
Patented Mar. 18, 1958

2,827,597

RECTIFYING MOUNTING

Eric Lidow, Los Angeles, Calif., assignor to International Rectifier Corporation, El Segundo, Calif., a corporation of California Application October 2, 1953, Serial No. 383,839

6 Claims. (Cl. 317—234)

This invention relates to metal or crystal rectifiers, and more particularly to mounting and connecting means for such rectifier units.

An object of this invention is to provide a mounting and connecting arrangement which permits desired interconnections of the rectifier units. A related object is to provide means for cooling.

Metal rectifiers of various types are well known. They ordinarily comprise a semiconductor material in the form of a crystal mounted on a conductive base which constitutes one terminal or electrode, and another contactor or electrode attached to the crystal which comprises the other terminal. Typical of such rectifiers are those utilizing germanium or silicon as the semi-conductor.

A form of rectifier unit commonly in use comprises a mass or block of a purified germanium or silicon crystal commonly in the form of a disc attached to conductor or base which forms one terminal and contacted by a second conductor ordinarily in the form of a wire-like lead which constitutes the other terminal. The latter element usually makes a point contact with the crystal. The attachments of the crystal to its contacting terminals can be by welding or soldering in a suitable manner to produce the desired rectifying characteristic.

In accordance with presently known practice, the semiconductor used in such units, for example germanium, can be treated to have P-type conductivity or N-type conductivity, or both types; and the particular arrangements referred to are known as PN junctions.

In accordance with the present invention there is provided a mounting arrangement for a crystal or metal rectifier unit whereby the crystal and its connections are effectively sealed from the atmosphere or surrounding medium by a positive rigid sealing arrangement which supports the connectors. A feature resides in the use of a ceramic or glass seal which effects a ceramic to metal seal.

Another features resides in the provision of complementary connector means, whereby two or more of such rectifying units may readily be connected and disconnected to and from each other. A feature resides in the provision of mating connectors which can readily be snapped together or pulled apart.

A related feature resides in the provision of cooling fins attached to the mounting means, which feature will often be desirable in rectifiers which handle substantial power.

The foregoing and other features of the invention will be better understood from the following detailed description and the accompanying drawings of which:

Figure 1:
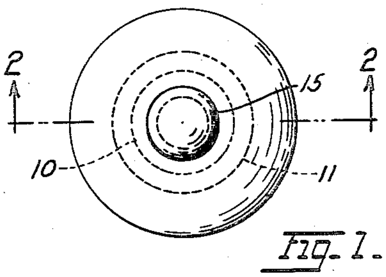
Fig. 1 is a top view, Fig. 2 an elevation view in cross section taken at line 2—2 of Fig. 1, and Fig. 3 a bottom view of a rectifying unit according to this invention.
Figures 2, 3, 4:
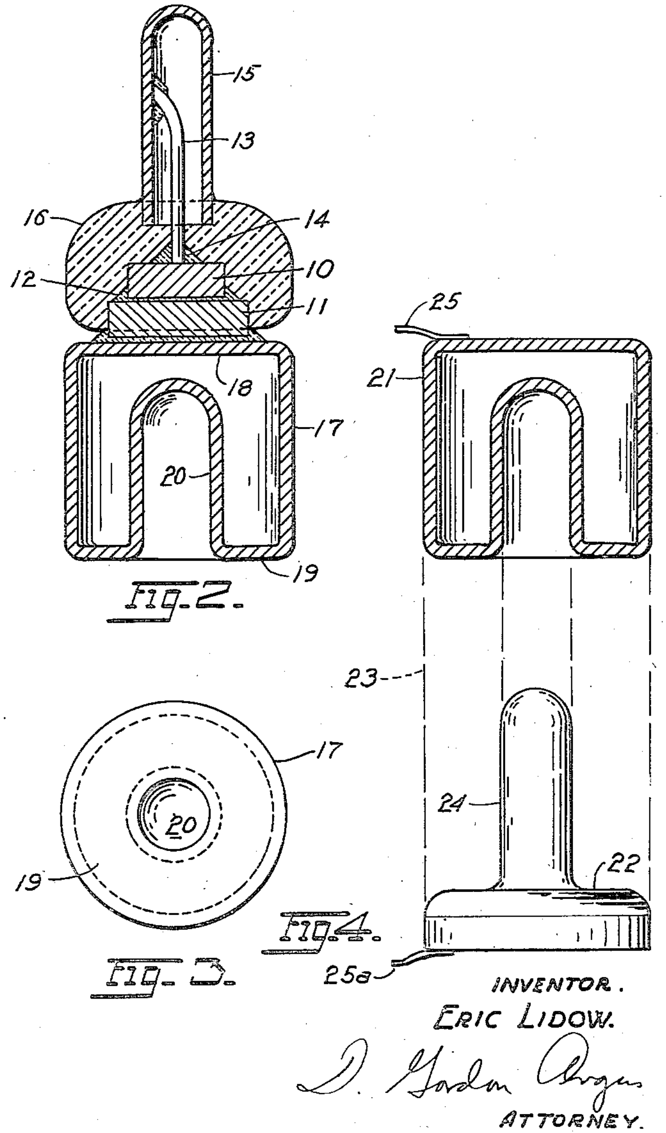
Fig. 4 is an elevation view, partly in section, showing means for connecting up a rectifier stack comprising units like that of Figs. 1 to 3.

Referring to the embodiment of Figs. 1 to 3, a block 10 in the form of a disc of the semi-conductor, ordinarily germanium or silicon crystal, is mounted on a disc-shaped electrical conducting base plate 11 which may, for example, be of aluminum or steel and secured thereto in a suitable manner as by solder at 12. The crystal can be of the type treated with selected additives to have P or N type conductivity with a layer of the opposite type conductivity adjacent the upper surface with the usual "barrier" at the interface between the two types of conductivity. Treatments of the crystal to obtain such characteristics are well known and need no further explanation.

A conductor 13 which may be in the form of a length of wire or rod, such as tungsten or Phosphor bronze or other inert metal, abuts the crystal at a point opposite the base element 11, and is soldered in place. For effective rectification the solder 12 constituting the film or interlayer between elements 10 and 11 is provided with a substance such as antimony which is effective for a block of N-type germanium; and the solder 14 securing the conductor 13 to element 10 is correspondingly provided with a particular ingredient such as indium which is effective where the upper surface layer of the block is to be of the P-type. Rectification in the unit just described will occur in a well known manner according to theories of rectification which have been published.

In accordance with the present invention I provide a unique mounting and connecting means for such units. In carrying out this mounting I provide a connector element 15 in the form of an elongated hollow cylindrical metallic member or stem open at the bottom and closed at the top preferably in the rounded form as shown; and the conductor 13 is suitably welded or soldered to the inside of stem 15 as shown. The assembly is secured in position by a ceramic seal 16 which may be in the form of a glass bead surrounding the semi-conductor block 10 and its contacting terminal member. At the top, the seal joins the outer circumference of stem 15 near its base where a glass-to-metal seal is formed; and similarly a glass-to-metal seal is formed where the seal material meets the periphery of base member 11. The solidified glass or ceramic mass 16 will hold the elements rigidly in position and maintain the connecting member 15 in its outstanding position relative to the unit. There is thus provided a self-contained rigid unit.

A complementary connecting member 17 is attached to the bottom side of the base member 11. This comprises a cylindrical metallic member closed at the top by the circular disc 18 which is soldered or welded to the bottom of base 11. The bottom portion 19 of member 17 likewise closes the cylinder and is provided centrally with a reentrant cylindrical portion or socket 20 adapted to receive a stem such as 15 of another similar unit in a snug resilient contact. The members 15 and 17 may be made of a thin resilient steel or the like so that the entrance of stem 15 of one unit will spring the wall of the reentrant portion or socket 20 of another unit and maintain a good contact.

It will be apparent that there is provided a complete rectifying unit provided with oppositely located complementary connecting members such that any number of such units may readily be connected in tandem; and just as readily disconnected when desired. The member 15 of one unit will simply be inserted within the complementary member 20 of the next adjacent unit by a resilient forcing action so that the tandem assembly may be set up. The end or terminal members of such a tandem arranged stack may simply be a complementary socket and plug such as elements 21 and 22 respectively of Fig. 4. Here the stack of units is represented by the dotted outline 23. The socket 21 can be of a form similar to member 17 of Fig. 2 so as to receive the uppermost connecting member 15 in the stack of units. The plug 22 is provided with a contacting member 24 which protrudes into the socket 20 of the lowermost member 17 of the stack. The members 21 and 22 may be provided with leads 25 and 25*a* respectively.

Figure 5:
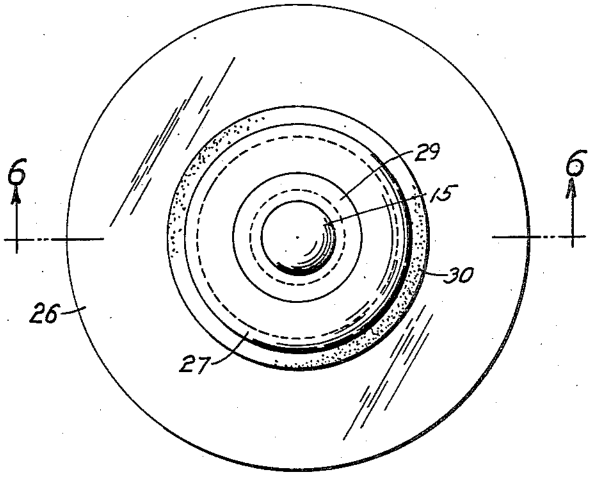
Fig. 5 is a top view and Fig. 6 an elevation cross-section view taken at line 6—6 of Fig. 5 of another unit embodying this invention.
Figures 6, 7:
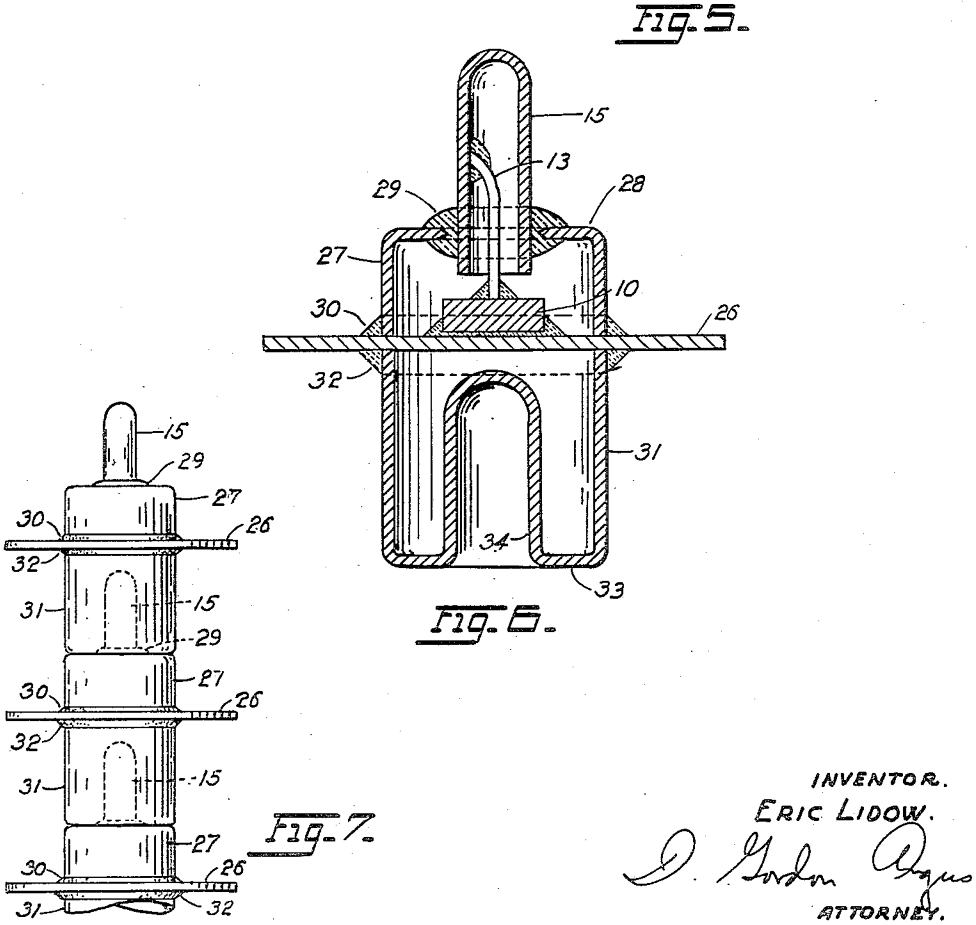
Fig. 7 is an elevation view showing the interconnection of a plurality of units according to Figs. 5 and 6.

Figs. 5 and 6 show a modification according to the invention which is particularly adapted for dissipating heat which may be generated in the unit. The crystal block 10 is mounted on a plate 26 and attached to a conductor 13 in a manner similar to that described in connection with Figs. 1 to 3. The plate 26 may be of material similar to the base plate 11 of Fig. 2 except that it is much larger than is required to support the element 10; and preferably it is of a good heat conducting material such as copper or aluminum which has good heat conducting properties. The terminal connector 15 is similar to that of Fig. 2. Instead, however, of mounting the unit within a glass bead, the unit is enclosed by a metallic inverted cup-like member 27 provided with a central opening through its circular top 28 through which the connector 15 protrudes without touching the metal of member 27. A ceramic seal 29 serves to seal to the metal of members 15 and 27 so as to hold these members rigidly in position relative to each other. The lower rim of member 27 is welded or soldered to the base member 26 as shown at 30. To provide the opposite connector from connector 15 there is provided a somewhat complementary cup-like member 31, its rim being welded at 32 to the bottom side of plate 26; and its bottom portion 33 being provided with the resilient reentrant cylindrical portion 34 into which there may be pushed the connector 15 of a similar unit. It will be apparent that a stack of series arranged units like that of Fig. 6 may be arranged in a manner like that described in connection with Figs. 1 to 4. Such a stack is shown in Fig. 7 from which it will be seen that the several discs or fins 26 are spaced apart providing passageways for air circulation between them. The stack can readily be cooled by blowing air through the spaces; or if desired by immersing the stack in cooling liquid such as oil.

Figures 8, 10:
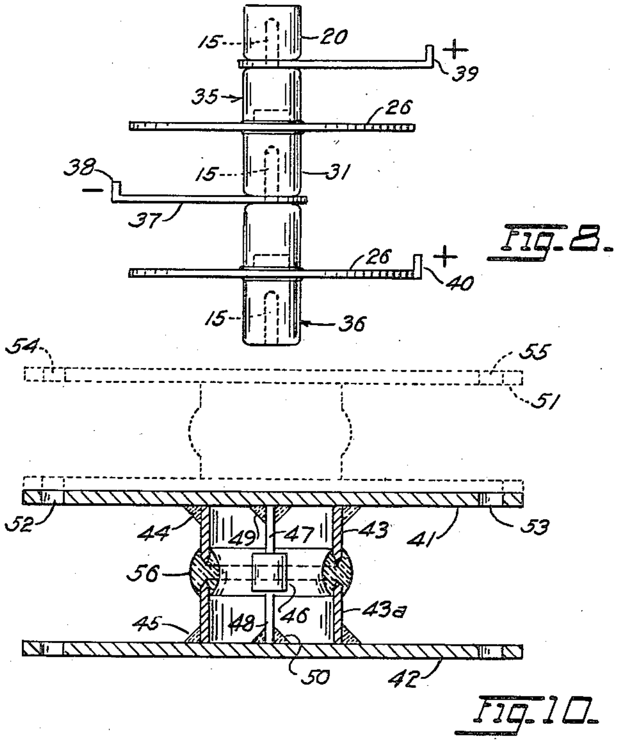
Fig. 8 is an elevation view showing another arrangement of a stack of rectifier units according to this invention.

Fig. 8 shows how a full wave connection can readily be made with two of the units of Figs. 5 and 6. One unit 35 is connected to the second unit 36 with a strip or conductor 37 interposed between the two units so as to make contact with the connecting element 31 of unit 35. This can readily be done by providing a hole through strip 37 through which the member 15 of unit 36 may protrude. Terminal 38 can be one terminal, for example the negative terminal, of the full wave rectifier; and terminals 39 and 40 attached respectively to the terminal strip above unit 35 and to the fin 26 of unit 36 constitute the remaining terminals, for example the positive terminals of the full wave rectifier.

If desired, there could of course be placed two or more units in series on either side of the central terminal strip 37 of the full wave rectifier arrangement.

It will be recognized, of course, that a bridge type rectifier connection could readily be effected in an analogous manner by utilizing four or more of the units.

Figure 9:
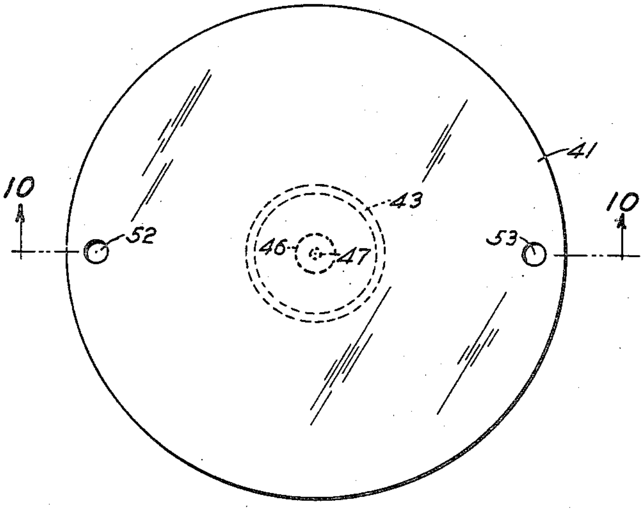
Fig. 9 is a top view and Fig. 10 an elevation view in cross-section taken at line 10—10 of Fig. 9 showing another unit constructed according to this invention.

Figs. 9 and 10 show another modification according to the invention. Here the cooling plates or fins 41 and 42 are soldered or welded to the ends of a cylinder at 44 and 45. This cylinder or tube comprises separated parts 43 and 43*a* which may be of metal; and the separation between the two parts is joined by a ceramic or glass seal 56 in a well known manner. The crystal 46, which may be in the form of a solid block is held centrally within the cylinder 43, 43*a* by means of its opposite conducting leads 47 and 48, which are attached to opposite faces of the crystal and welded to plates 41 and 42 at 49 and 50. The plates 41 and 42 will constitute the opposite terminals of the unit. A series stack of such units may readily be built up by assembling a number of units in tandem as indicated by the dotted position of unit 51. The units may be attached to each other by provision of suitable holes 52 and 53 through the plates or fins. By having the holes of all the plates aligned, a suitable rod of insulating material or the like may if desired be placed along the center lines 54 and 55 through all the aligned holes and tightened at the ends.

It will be apparent that the type of unit shown in Figs. 9 and 10 is susceptible to full wave connection or bridge connection as in the case of the other units described in this application.

Crystal rectifiers of the general type referred to herein have usually been made in very small sizes and have been designed for handling small currents which have usually not involved serious problems of heat removal. But such rectifiers are not necessarily limited to such small sizes nor to the handling of small currents. In the larger current carrying sizes the problem of dissipating heat is more acute. It should be understood that the mounting and connecting arrangements according to this invention are useful in all sizes, and furthermore are not limited to the particular forms or types of rectifier units illustrated and described herein, which are given merely by way of example of metal or crystal rectifier types with which the present invention is useful. Furthermore, the mounting and connecting arrangement is useful regardless of whether cooling arrangements, such as the cooling fins are also present.

It will be recognized that by my invention there is provided a mounting unit for a metal or crystal type rectifier wherein the unit itself is thoroughly sealed from the atmosphere, or surrounding medium and wherein connector elements are provided as an integral part of the mounting. Any desired number of units may be connected together in desired arrangements or combinations; and may just as readily be disconnected from each other.

The units are susceptible readily to the use of cooling fins as integral parts thereof; and owing to the sealing of the active rectifier parts from the atmosphere or other medium the units may be cooled in any desired medium such as by air or oil or other fluid. Owing to the presence of cooling provision, the size of the crystal units may be increased as desired and numbers of them may be put together in spite of the dissipation of heat from the individual units.

It should be understood that the particular embodiments of the invention described herein are given by way of illustration rather than of limitation, and the invention is not limited except in accordance with the scope of the appended claims.

I claim:

1. A rectifier unit of the type having a semiconductor block with a face mounted on a metal base plate and an opposite face connected to a conductor; mounting means comprising a metal stem provided with a hollow into which the conductor protrudes and is attached to the stem, a ceramic bead embedding the block and a part of the stem adjacent the block and sealed to the stem and to the base plate, and a metallic member attached to the side of the base plate opposite the block, said metallic member having at its side remote from the base plate a reentrant socket adapted to receive a connecting stem of another electrical unit, whereby a plurality of units may be connected in tandem.

2. A plurality of rectifier units connected in tandem, each of said units comprising a base plate, a semiconductor block attached to one side of the base plate, a connecting stem protruding from the side of the block opposite the base plate and electrically connected to the block, rigid sealing means comprising insulation attached to the base plate and to the stem and securing the block and stem in rigid relationsihp to the base plate, and a connecting socket attached to the side of the base plate opposite the block, said socket being adapted to receive the stem of another unit.

3. A rectifier unit comprising a semi-conductor block having a pair of faces; a metal base plate conductively mounted to one of said faces; a hollow stem; a conductor attached to the second of said faces and also to the inside of the hollow stem; a ceramic bead embedding said block and a part of the stem and a part of the metal base plate, whereby the block and its connections to the conductor and to the base plate are sealed from the surrounding medium and whereby the stem is held in fixed relationship with the block to form a rigid assembly; and a metallic socket member mounted to the metal base plate on the side of the base plate remote from the block, said socket member being adapted to receive the stem of another electrical unit, whereby a plurality of electrical units may be connected in tandem.

4. A rectifier unit according to claim 3 in which the socket member comprises a cylindrical portion, a disc portion closing an end of the cylindrical portion and being attached to said metal base plate, and a bottom portion closing the other end of said cylindrical portion, and a resilient reentrant portion at a mid-point of said bottom portion to form said cavity for receiving the stem of another electrical unit, all of said portions being made of conductive material, and being conductively interconnected so as to make electrical connection between the reentrant portion and the metal base plate.

5. A rectifier unit according to claim 3 in which the ceramic bead also embeds a part of said conductor, thereby also holding the conductor in fixed relationship to the stem and the block.

6. In a rectifier unit of the type having a semi-conductor block with a face mounted on a metal base and an opposite face connected to a conductor: mounting means comprising a metal stem provided with a hollow into which the conductor protrudes and is attached to the stem, a ceramic mass embedding the block and the part of the stem, adjacent the block and sealed to the stem and to the base, and a metallic member containing a socket, said metallic member being attached to the side of the base opposite the block.

References Cited in the file of this patent

UNITED STATES PATENTS

| | | |
|---|---|---|
| D. 156,501 | Gates | Dec. 20, 1949 |
| 2,406,405 | Salesbury | Aug. 27, 1946 |
| 2,472,938 | Brittain et al. | June 14, 1949 |
| 2,533,001 | Eberhard | Dec. 5, 1950 |
| 2,586,609 | Burke | Feb. 19, 1952 |
| 2,693,556 | Gahagan | Nov. 2, 1954 |
| 2,694,168 | North et al. | Nov. 9, 1954 |
| 2,741,686 | North et al. | Apr. 10, 1956 |
| 2,753,497 | Jenkins et al. | July 3, 1956 |